United States Patent
Rao et al.

(10) Patent No.: US 7,570,185 B2
(45) Date of Patent: *Aug. 4, 2009

(54) DATA ACQUISITION SYSTEM FOR MEDICAL IMAGING

(75) Inventors: Naresh Kesavan Rao, Clifton Park, NY (US); Jianjun Guo, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 940 days.

This patent is subject to a terminal disclaimer.

(21) Appl. No.: 11/023,669

(22) Filed: Dec. 28, 2004

(65) Prior Publication Data

US 2006/0139198 A1 Jun. 29, 2006

(51) Int. Cl.
*H03M 1/00* (2006.01)
(52) U.S. Cl. .................. 341/138; 341/120; 341/118
(58) Field of Classification Search ......... 341/117–120, 341/138, 141
See application file for complete search history.

(56) References Cited

U.S. PATENT DOCUMENTS

| | | | |
|---|---|---|---|
| 4,965,578 A | 10/1990 | Poujois | |
| 5,124,706 A | 6/1992 | Gerdes | |
| 5,272,627 A * | 12/1993 | Maschhoff et al. | 378/4 |
| 5,371,501 A | 12/1994 | Garverick et al. | |
| 6,670,904 B1 | 12/2003 | Yakovlev | |
| 6,720,812 B2 | 4/2004 | Turner et al. | |
| 6,731,231 B2 | 5/2004 | Roovers et al. | |
| 6,798,864 B2 | 9/2004 | Petrick et al. | |
| 7,053,806 B1 * | 5/2006 | Rao et al. | 341/120 |
| 2004/0017494 A1 | 1/2004 | Lu et al. | |
| 2004/0161022 A1 * | 8/2004 | Glazko et al. | 375/152 |
| 2005/0093722 A1 * | 5/2005 | Smith et al. | 341/118 |

* cited by examiner

*Primary Examiner*—Jean B Jeanglaude
(74) *Attorney, Agent, or Firm*—Patrick K. Patnode

(57) ABSTRACT

A system and a method for converting an analog signal to a digital signal are provided. The technique involves receiving a sampled analog signal, and selecting one of a plurality of segments of a segmented relation between DAC output values and desired ADC input values. Desired gain and offset values are applied to the DAC output values or to the sampled analog signal based upon the selected segment. The sampled analog signal is converted to a digital signal based upon the desired gain and offset values.

23 Claims, 9 Drawing Sheets

DATA ACQUISITION SYSTEM FOR MEDICAL IMAGING

BACKGROUND

The invention relates generally to signal processing, and more particularly to systems and methods used in the transformation of image signals between the analog and digital domains to aid in image signal processing.

Signal processing is a valuable tool for various applications that involve data transmission, data storage, and the like. One aspect of signal processing, for certain applications, is to convert an analog signal into its digital equivalent to facilitate storage, transmission, workability, signal conditioning, noise filtering, and the like. For example, a digital X-ray panel may convert a scanned X-ray image into a digital format for subsequent processing, storage and image reconstruction.

Various signal processing techniques exist that provide transformation of image signals between the analog and digital domains. One such method for performing analog-to-digital (A/D) signal conversion utilizes a single digital-to-analog converter (DAC) for providing a base analog signal for comparison to an input analog signal that requires conversion.

Although such a method provides high accuracy, one disadvantage with A/D conversion using a single DAC is that the process is slow. This is because each input analog signal is converted individually into a digital equivalent by a dedicated channel, and all the channels are driven by the same DAC. The counter that provides a digital count to the DAC, therefore, has to run from the lowest count to the highest count before all channels perform conversion of each input analog signal into digital equivalents.

Attempts have been made to increase the speed of A/D conversion process. One method of increasing the speed is by increasing the number of DACs so that each channel has a dedicated DAC. However, such a method may not be cost effective in certain applications. For example, a digital X-ray panel using a single DAC for A/D conversion process has a speed of 30 frames per second (fps), which may not be suitable for applications requiring higher frame rate. The speed may be improved by increasing the number of DACs. However, due to the increase in cost and complexity of the additional circuitry, such a digital X-ray panel becomes prohibitively expensive and complex.

There is therefore a need for a system and method to improve the speed of A/D conversion process.

BRIEF DESCRIPTION

According to one aspect of the present technique, a system and a method for converting an analog signal to a digital signal are provided. The technique includes receiving a sampled analog signal, and selecting one of a plurality of segments of a segmented relation between DAC output values and desired ADC input values. Desired gain and offset values are applied to the DAC output values or to the sampled analog signal based upon the selected segment. The sampled analog signal is then converted to a digital signal based upon the desired gain and offset values. The system and method may be implemented in digital X-ray systems.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
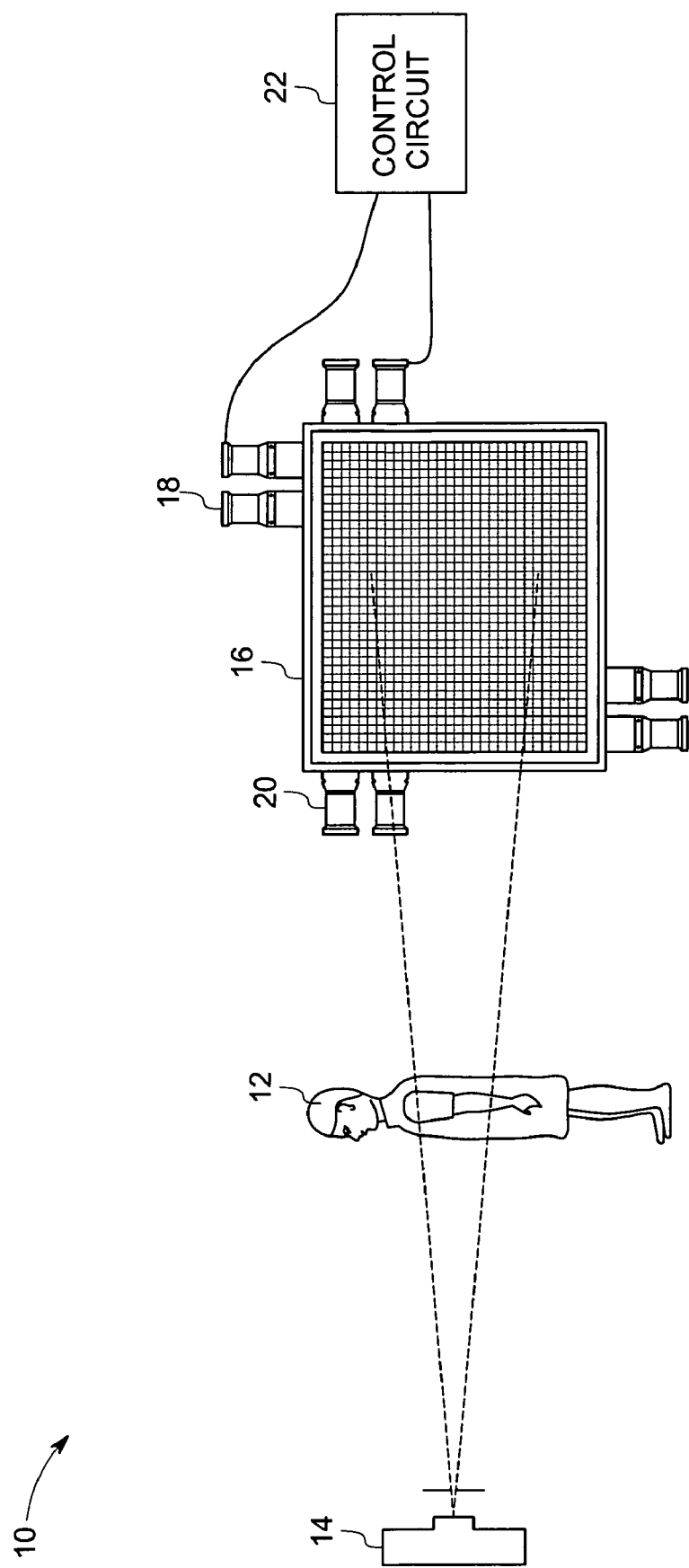
FIG. 1 is a diagrammatic view of an exemplary digital X-ray system, in which signal conversion is implemented in accordance with aspects of the present technique.

In the subsequent paragraphs, various aspects of a technique for signal conversion will be explained in detail. The various aspects of the present technique will be explained, by way of example only, with the aid of figures hereinafter. Referring generally to FIG. 1, the present technique for conversion of analog signals to digital signals will be described by reference to an exemplary digital X-ray system designated generally by numeral 10. It should be borne in mind, however, that the technique may find application in a range of settings and systems, and that its use in the X-ray system shown is but one such application.

The digital X-ray system 10 of FIG. 1 is operable to capture an X-ray projection of a portion of the body of a subject 12 under medical examination. However, as will be appreciated by those skilled in the art, the digital X-ray system 10 may also be utilized for non-destructive evaluation (NDE) of materials, such as castings, forgings, or pipelines, inspection of parts, parcels and baggage, and other such applications. The digital X-ray system 10 comprises an X-ray source 14 that is used to scan the subject 12. The X-ray source 14 generates X-ray beams that penetrate through the subject 12. In a typical medical application, the X-ray beams may be attenuated based on the texture of the organs, skin, lesions, muscle, bones and the like, in the various portions of the body of the subject 12. The attenuated X-rays are captured by a digital X-ray panel 16, as illustrated in FIG. 1, which comprises a plurality of photodiodes that form a pixel array. The projection thus formed, is read row-by-row or column-by-column by one or more data modules 18, where each line of pixels may be enabled for scanning, by one or more scan modules 20. Control circuitry 22 is used to control the operation of the data modules 18 and the scan modules 20.

Figure 2:
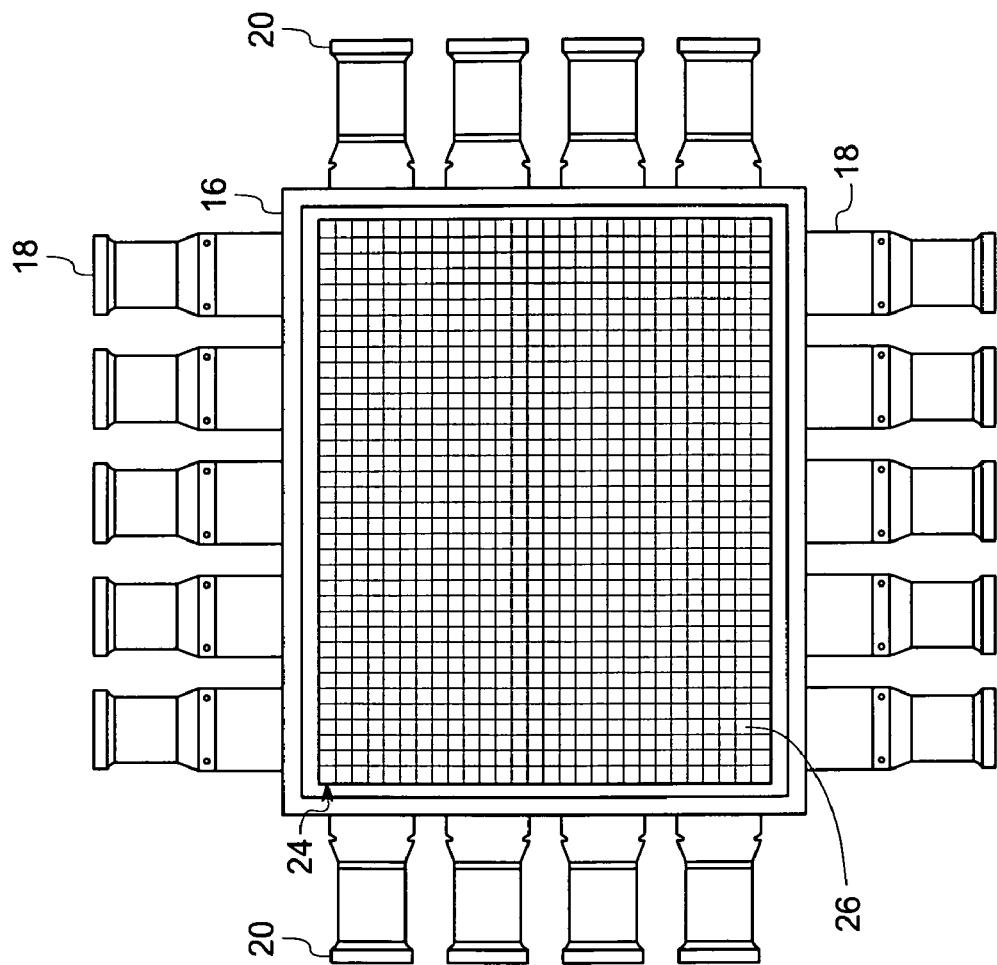
FIG. 2 is a diagrammatic view of an exemplary digital X-ray panel of a type that may be used in a system such as that of FIG. 1 for generating analog signals to be converted to digital signals in accordance with aspects of the present technique.

FIG. 2 is a diagrammatic view of an exemplary digital X-ray panel 16. The digital X-ray panel 16 comprises a plurality of rows 24, each of which contains a plurality of photodiodes defining the pixels 26 arranged contiguously to form a pixel matrix or a pixel array. During operation of the X-ray panel 16, received X-ray radiation is converted to a lower energy form, and each of the photodiodes 26 has an initial charge that is depleted by an amount representative of the amount of X-ray radiation incident on the respective location of each photodiode 26. The data modules 18 are operable to read the amount of charge from each of the photodiodes 26. Each row 24 is scanned by the data modules 18 in conjunction with the scan modules 20 to read the amount of charge from all the pixels 26 in that row 24 (or column). The scan module 20 corresponding to a row 24 enables reading the pixels 26 in that row 24. When the pixel 26 is enabled for reading, the data module 18 corresponding to that pixel 26 reads the charge stored on the photodiode or pixel 26 by recharging the photodiode. Having read the charge value from the plurality of photodiodes 26, the data module 18 converts the charge value into a digital equivalent for further processing.

Figure 3:
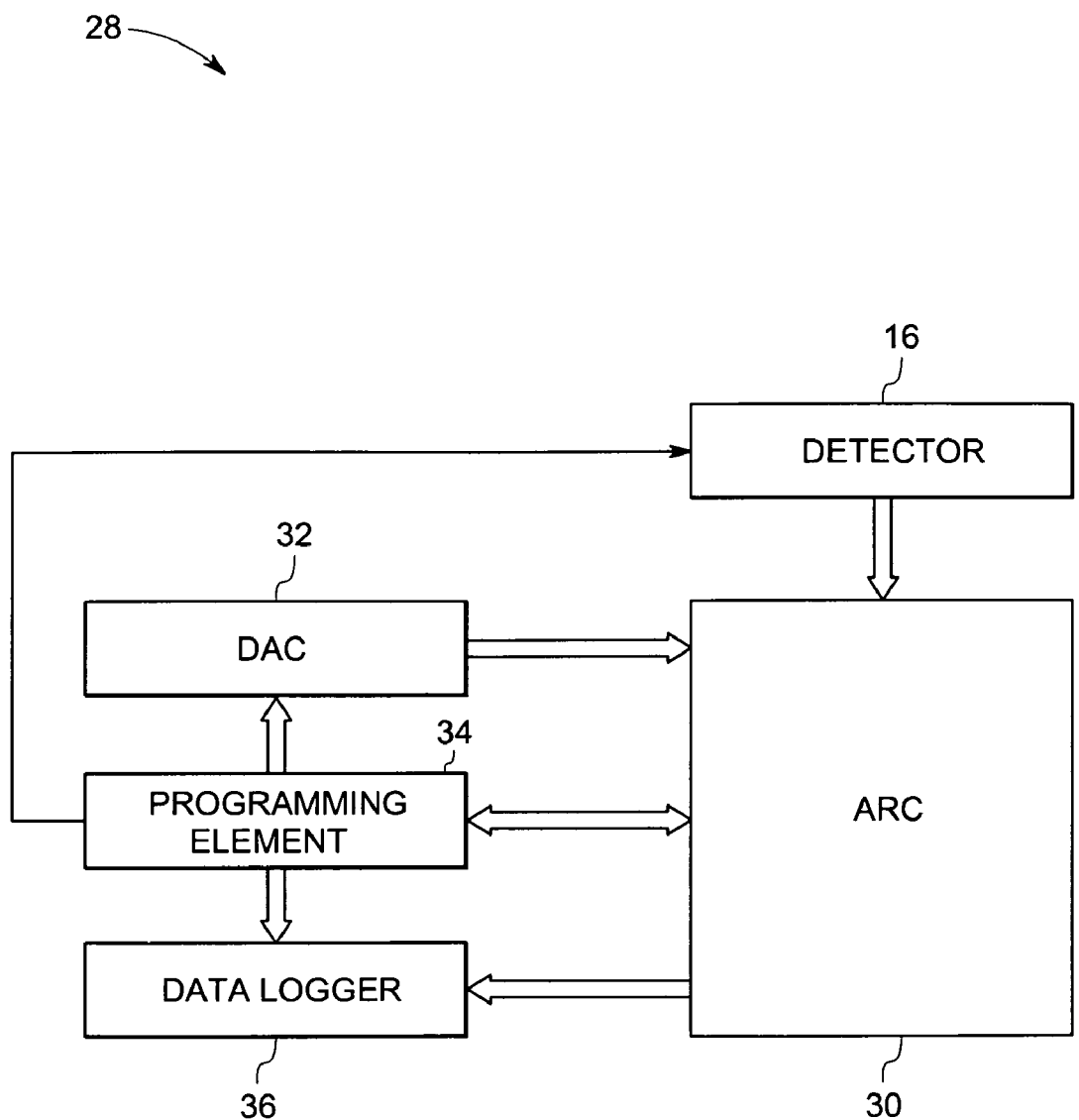
FIG. 3 is a diagrammatic view of an exemplary digital acquisition system for the digital X-ray panel shown in FIG. 2.

Turning now to FIG. 3, a diagrammatic view of an exemplary digital acquisition system 28 for the digital X-ray panel 16 of FIG. 2 is illustrated. The digital acquisition system 28 comprises an analog readout chip (ARC) 30, which comprises circuitry for reading the charge from (in practice the recharge to) the photodiodes 26 in the X-ray panel 16. The ARC 30 processes and digitizes the charge from the photodiodes 26. Detailed functionality of the ARC 30 will be explained later in the description. For facilitating digitization of the charge from the photodiodes 26, a digital-to-analog converter (DAC) 32 may be utilized. Driven by a counter, the DAC 32 provides a DAC output signal for circuitry in the ARC 30 to compare the charge values read from the photodiodes 26. The DAC output signal may define a linear portion and a polynomial portion, such as a linear portion, a quadratic portion, a cubic portion, and the like. The DAC output signal will be explained in further detail below.

In accordance with the present technique, the DAC output signal may be divided into segments to improve the speed of scanning an entire row 24 of pixels 26 and, consequently, the overall speed of digitizing the X-ray image. Therefore, a segment that comprises the location of the charge value (input signal) may be desirably located. For locating a segment, segment-gain information may be required, which may be provided by a programming element 34. Moreover, other programmable options, such as dynamic bandwidth control and the data readout may be set by the programming element 34. A data logger 36 collects the digitized data from the ARC 30 and transmits the data to digital circuitry for image processing and reconstruction of a useful image.

Figure 4:
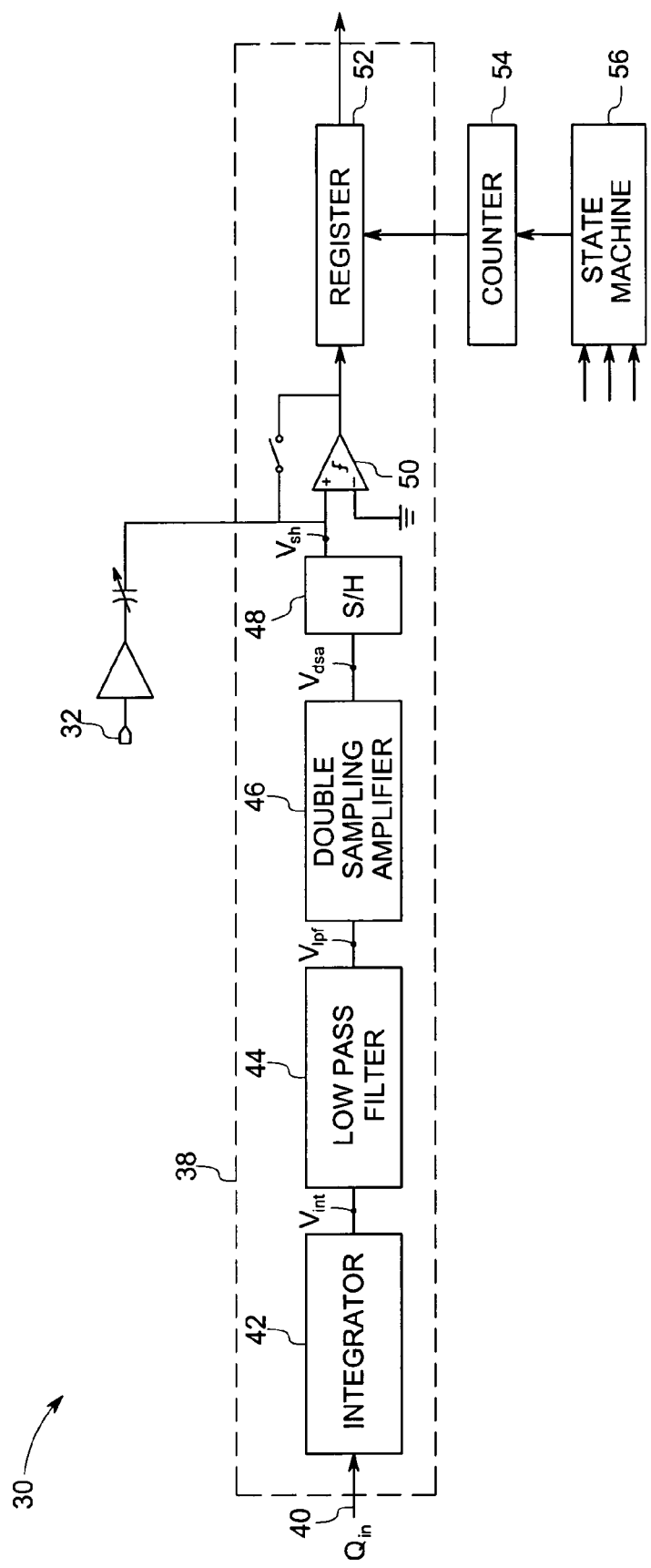
FIG. 4 is a diagrammatic view of an exemplary system shown in FIG. 3, in accordance with aspects of the present techniques.

FIG. 4 is a diagrammatic view of the exemplary ARC 30 shown in FIG. 3, in accordance with aspects of the present techniques. ARC 30 comprises a plurality of channels 38, each being operable to read the charge value from a photodiode or pixel 26 and to provide the digital equivalent. The DAC 32 is common to all the channels 38, so that the DAC 32 provides the DAC output signal to each of the channels 38, which respectively compare the charge value with the common DAC output signal. An input signal 40, comprising a charge value from a photodiode or pixel 26, is provided to the channel 38, as illustrated. Each channel comprises an integrator 42, which integrates the input signal 40 (charge value $Q_{in}$) for conversion into an equivalent voltage value, $V_{int}$, which is fed into a low-pass-filter 44 for reducing noise. Voltage signal outputted from the low-pass-filter 44, $V_{lpf}$, is fed into a double sampling amplifier 46, which provides a desirable gain to $V_{lpf}$. The output of the double sampling amplifier 46, $V_{dsa}$, is sampled and held in sample and hold (S/H) circuitry 48. The double sampling amplifier 46 in conjunction with the low-pass-filter 44 provides correlated double sampling process to reduce offset and flicker noise. Integrator 42, low-pass-filter 44, and double sampling amplifier 46 together form an analog front-end. The analog front-end may therefore be decoupled from the rest of the channel 38 by the S/H circuit 48. Pipelined conversion is thus achieved by the use of the S/H circuit 48.

The output of the S/H circuit 48, $V_{sh}$, and the DAC output signal provided by the DAC 32 may be fed as input into a comparator 50 for comparison. The comparator 50 provides either a high or a low output based on the comparison of $V_{sh}$ and the DAC output signal provided by the DAC 32. The channel 38 also comprises a register 52, which is provided with a counter value from a counter 54. The counter value provided by counter 54 is proportional to the digital code provided to the DAC 32 for generating the DAC output signal. The output of the comparator 50 may be configured to freeze the counter value in the register 52 when the output of the S/H circuit 48 and the DAC output signal provided by the DAC 32 are equal. Because the counter value provided to DAC 32 and register 52 are proportional, the frozen counter value in the register 52 is representative of the digitized output of the input signal (charge value) of the corresponding pixel 26 read by channel 38.

A state machine 56 may be utilized to synchronize the counter 54 and the count value provided to the DAC 32 at any instant. It may be noted that the integrator 42, low-pass-filter 44, double sampling amplifier 46, S/H circuit 48, comparator 50 and register 52 comprise a single channel 38 that reads a single photodiode or pixel 26. In one embodiment, there are thirty-two different channels 38 hard-wired into a single ARC 30. DAC 32 is common to the entire system. Counter 54, and state machine 56, however, are separate components, within the ARC 30 that are common to all thirty-two channels 38. Each of the data modules 18, described previously with reference to FIG. 2, may comprise eight analog readout chips 30, and a single digital analog readout chip. Therefore, each data module 18 can read and digitize 256 pixels simultaneously. Thus, if a row of 1024 pixels 26 has to be read simultaneously, 4 (=1024/256) data modules 18 may be employed. Detailed operation of the ARC 30 will be explained below.

Figure 5:
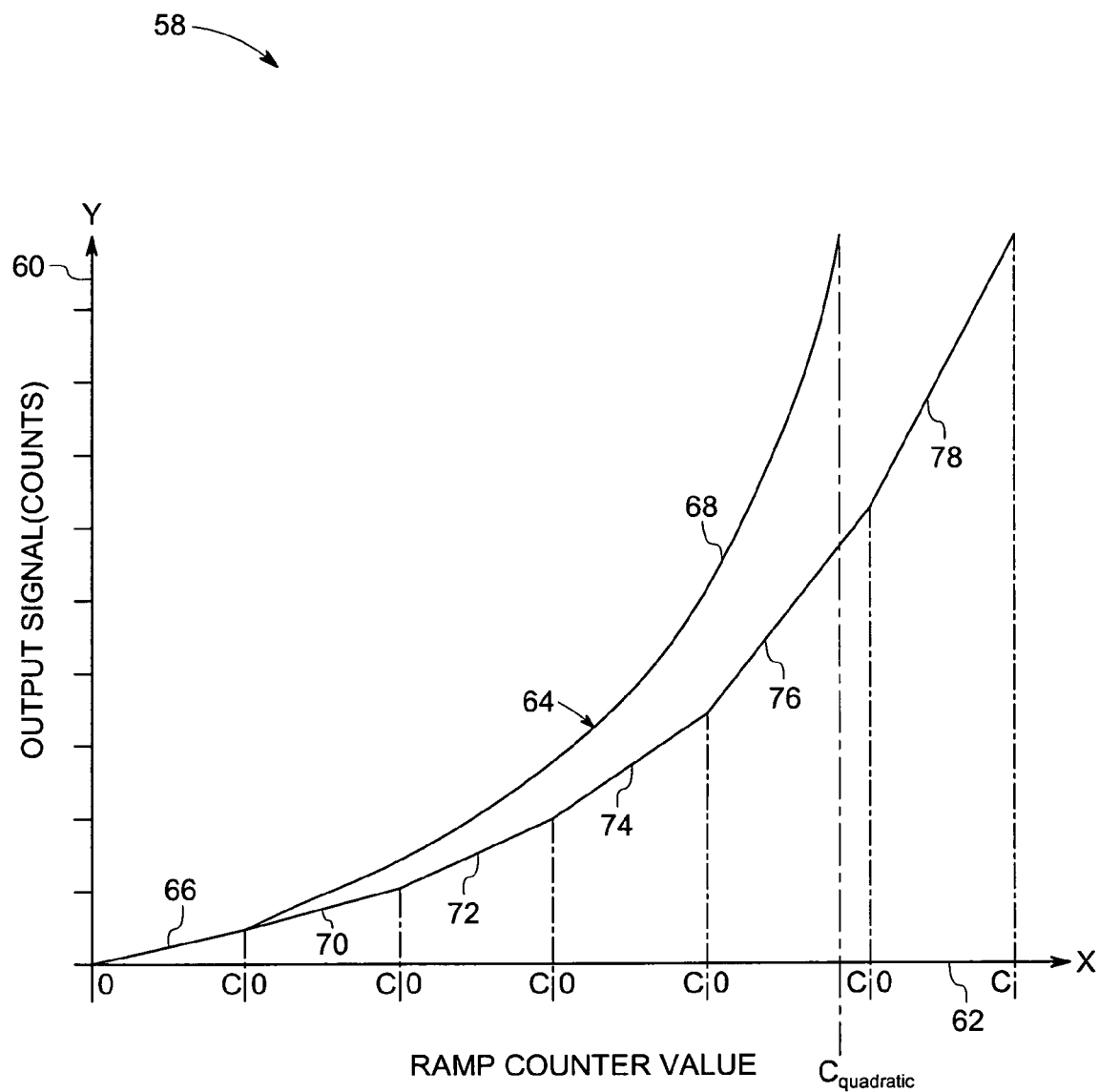
FIG. 5 is a graphical view of a path followed by the DAC output signal, illustrating a segmentation process in accordance with aspects of the present technique.

Referring now to FIG. 5, a graphical illustration 58 of a path followed by the DAC output signal is shown. The illustration 58 shows the output signal values, in counts, on the y-axis 60 plotted against ramp counter values on the x-axis 62. The ramp counter value 62 is proportional to the digital code values that are fed into the DAC 32 for generating the DAC output signal that follows a linear-polynomial ramp 64. Therefore, the DAC output signal increases in steps or counts. The linear-polynomial ramp 64 defined by the DAC output signal begins with a linear portion 66 until a desirable ramp counter value C. Beyond ramp counter value C, the ramp may advantageously define a polynomial portion 68 for improvement of signal-to-noise ratio of the digital output of the scanned X-ray image.

Quantum noise is the noise intrinsic to an X-ray image. The amount of quantum noise produced by an X-ray beam is equal to the square root of the number of X-rays incident on the detector 16. Therefore, at high X-ray flux, the system may be prone to more quantum noise and relatively less electronic noise. Advantageously, quantization step can made proportional to the quantum noise, without any loss of information.

In other words, when the signal is small, small steps may be employed, and when the signal is large, step size may be increased.

In one specific embodiment, the linear-polynomial ramp 64 may define a linear portion 66 followed by a quadratic portion 68, and may be therefore termed as a linear-quadratic ramp. Furthermore, the polynomial portion 68 may define a cubic curve, or other polynomial curves that may be advantageously employed. The particular relationship between the input and output (count) values may follow other profiles and relations in other applications. Moreover, the segmentation of the relationship, as described below, may result in more or fewer segments than those described here, and will typically result in different offsets and gains (slopes) for each segment, also as described below.

Referring back to FIG. 4, the output of the S/H circuit 48 is provided to the comparator 50. The value of the DAC output signal (initially zero) is checked against $V_{sh}$. If the DAC output signal at that instant is not equal to the output of the S/H circuit 48, the ramp counter value that provides counts to the DAC 32 and the register 52 is increased to the next count value. The linear-polynomial relationship (linear-quadratic, linear-cubic, etc.) between the ramp counter and the digital code may be appropriately implemented based on the applications. For example, for the linear portion, the ramp counter and the digital code to the DAC may be equal. Beyond a certain ramp counter value, e.g. C in FIG. 5, the relationship may be polynomial. The ramp counter in FIG. 5 and the counter 54 in FIG. 4 increment linearly. However, the digital code provided to the DAC 32 and the resulting analog signal will be linear-polynomial. When the DAC output signal becomes equal to $V_{sh}$, the comparator 50 provides a signal that freezes the counter value residing in the register 52. Therefore, the register 52 contains a digital value corresponding to the input signal from the respective channel (i.e., the charge value for the photodiode or pixel 26 of FIG. 2 in the X-ray system implementation). By applying the relationship between the DAC digital code and the ramp counter value, an equivalent DAC digital code to the counter value yields the charge value stored on the photodiode 26.

Those skilled in the art will appreciate that if the maximum possible value of the output of S/H circuit 48 is divided by a greater number of total counts (i.e. a finer comparison), the resolution of the digital output corresponding to the input signal will be increased. For example, if the maximum value attained by the output of S/H circuit 48 is 5 volts, and the total number of counts that may be provided to the DAC 32 is 1024, the step size of the ramp counter value will be 5/1024. However, if the total number of counts that may be provided to the DAC 32 is 2048, the step size of the ramp counter value will be 5/2048, which, being smaller, provides higher resolution. Also, for digitizing a signal in the higher range (e.g., 5 volts) at the S/H circuit 48, about 2048 steps may have to be provided to the DAC 32. Furthermore, if the signal to be digitized is greater (e.g., 10 volts), then to produce the desired resolution, more number of steps (ramp counter values) may be required.

In the X-ray system implementation described above, because the thirty-two different channels 38 are provided with the same DAC output signal that is used for comparison in each of the channels 38, and given that these different channels 38 may have different charge values to be compared, the DAC 32 may provided for all the counts from minimum to the maximum count. The amount of time required for the whole image to be digitized is therefore limited by the time taken for the DAC 32 to traverse from the minimum to maximum count. Therefore, this may limit the frame rate of scanning the digital X-ray panel. However, by using the linear-polynomial ramp 64, it will be understood that much fewer than 2048 steps may be needed to dynamically cover the range of 5 volts.

The graphical illustration 58 further shows a segmentation process for achieving a higher signal conversion rate. Segmentation may be achieved by using the generally linear portion 66, and transforming it to generate portions of the polynomial portion 68. In other words, counter values provided to the DAC 32 follow a linear ramp, until the ramp counter value C, hereinafter referred to as the base ramp 66. The base ramp 66 is common to the entire ramp 64. The remaining portions of the curve 64 may be generated within the ARC 30 on a channel-by-channel basis by applying gain and offset values to the base ramp 66.

Moreover, while digitizing the input signal 40, the ARC 30 may coarsely compare $V_{sh}$ against ramp count values C, 2C, 3C, 4C, and 5C. If the comparator 50 on a given channel actuates (i.e., changes output state) on application of any of the above ramp count values, such actuation is indicative of $V_{sh}$ lying in the segment ending that ramp count value. For example, at 2C if the comparator 50 does not actuate, and at 3C, the comparator 50 actuates indicating that $V_{sh}$ is less than 3C, then the coarse A/D conversion registers that the output of S/H circuit 48 lies between the counts 2C and 3C, or in segment 72. The base ramp 64 received by this particular channel 38 is manipulated by applying gain and offset values to recreate the segment 72. Once a segment is identified as having the digital equivalent of the output of S/H circuit 48, then a fine A/D conversion similar to that described previously with respect to linear-polynomial ramp 64, may be performed. For example, the counts between 2C and 3C are compared against the output of S/H circuit 48, such that the counts follow the path defined by segment 72. Such an autoranging process enhances the speed of A/D conversion. It may be noted that any of the segment to be traced could be generated using a base ramp 66 and by adding an offset and multiplying by a gain value. This may be performed to achieve the desired linear portion in the corresponding segment, which has the desired starting value and slope. In general, then, a segment i can be described by the following equation:

$$V(i) = V_{offset}(i) + \text{Gain}(i) * V_{base}$$

where, V(i) is the desired output voltage for comparison in segment i;

$V_{base}$ is the base voltage of linear portion 66;

Gain(i) is the gain value, which is multiplied to base voltage $V_{base}$ to transform $V_{base}$ to the desired slope in segment i;

$V_{offset}(i)$ is the desired offset voltage that is added to Gain(i) *$V_{base}$ to reach segment i.

It will be understood by those skilled in the art that the base ramp, which in the above example is the generally linear portion 66 of the linear-polynomial ramp 64, may lie in any of the segments. In other words, if the generally linear portion 66 lies in the middle of the linear-polynomial ramp 64, then the offset voltage $V_{offset}(i)$ corresponding to a segment i in the left of the base ramp would be negative.

Figure 6:
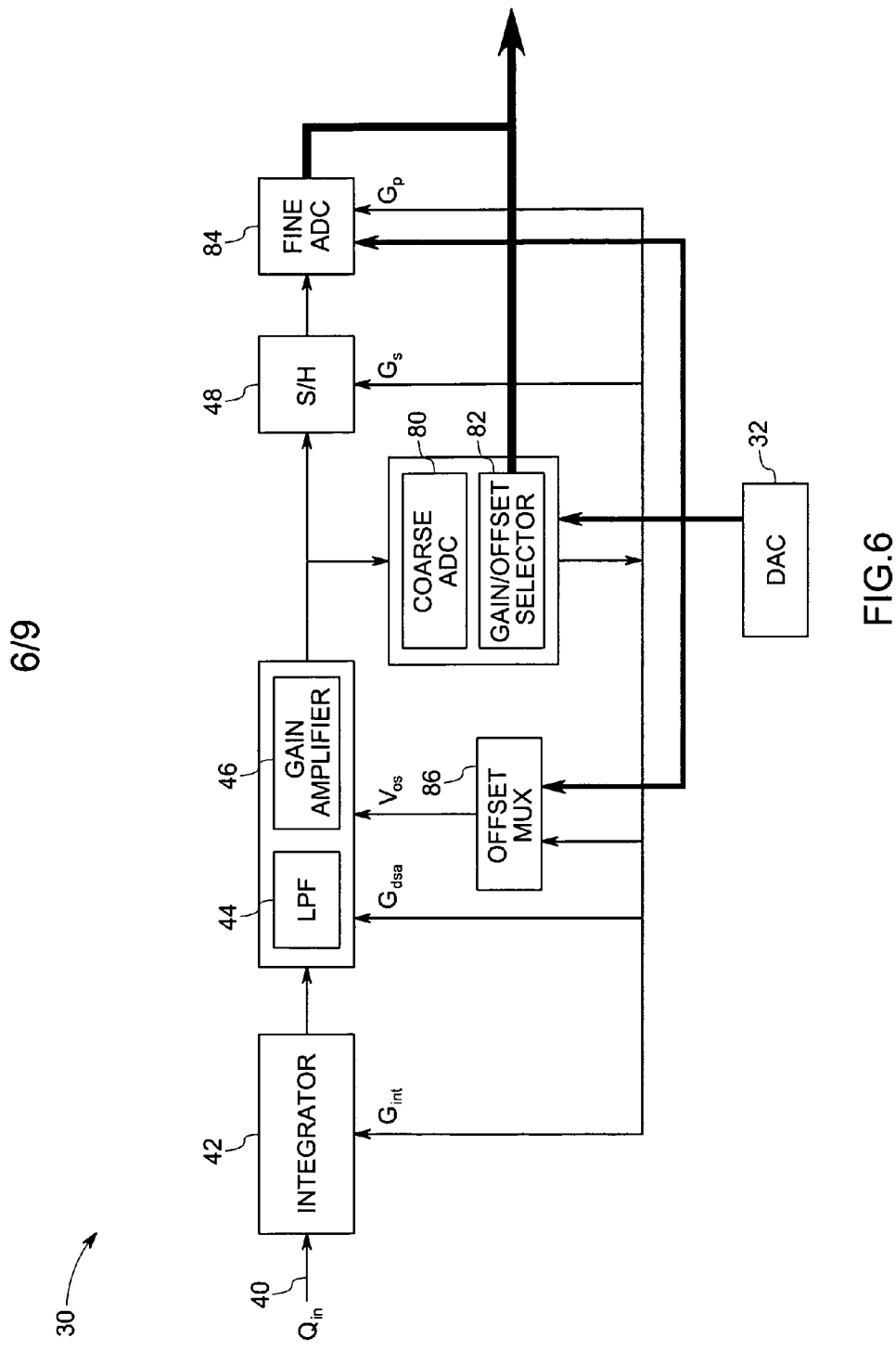
FIG. 6 is a diagrammatic view of an exemplary embodiment of the system shown in FIG. 3 in accordance with aspects of the present technique.

Referring now to FIG. 6, a diagrammatic view of an exemplary embodiment of the ARC 30 of FIG. 3 is illustrated. The charge value $Q_{in}$ 40 from the detector 16 is converted to a voltage by the integrator 42. The output of the integrator 42 is fed to a low-pass-filter 44 and amplified by the double sampling amplifier 46. A coarse A/D conversion is performed by block 80 to determine a suitable segment. After being processed by block 80, the output comprises a digital equivalent of the segment information. This segment information may comprise one or more bits indicating the segment. The bits also form the exponent of the digital output of the charge value $Q_{in}$ 40. Based on the segment information, appropriate gain Gain(i) and offset values $V_{offset}$(i) may be selected by a gain/offset selector 82. Once the gain and offset values are selected, appropriate gain values are provided, such as gain $G_{int}$ to integrator 42, gain $G_{dsa}$ to double sampling amplifier 46, gain $G_s$ to S/H circuit 48, and gain $G_p$ to a fine A/D conversion block 84. The gain/offset selector 82 therefore manipulates the base ramp 66 from the DAC 32 by applying gains $G_{int}$, $G_{dsa}$, $G_s$, $G_p$ and $V_{offset}$(i) to generate the $i^{th}$ segment. The offset voltage $V_{offset}$ is generated by an offset multiplexer 86. The signal gain of channel 38 may therefore be defined by $G_{channel}=G_{int}*G_{dsa}*G_s$. The transposed signal is then sampled and held by the S/H circuit 48 before being digitized by the fine A/D conversion block 84 to provide the mantissa. The segment offsets and references for both coarse and fine ADC are generated by time division multiplexing of the DAC, and, pipelining the charge value $Q_{in}$ 40 in the S/H circuit 48.

The output of the fine A/D conversion block 84 comprises the mantissa of the digital value. Thus, the digitized signal corresponding to the charge value $Q_{in}$ 40 comprises the segment information from block 80 and the output of the fine A/D conversion block 84.

Figure 7:
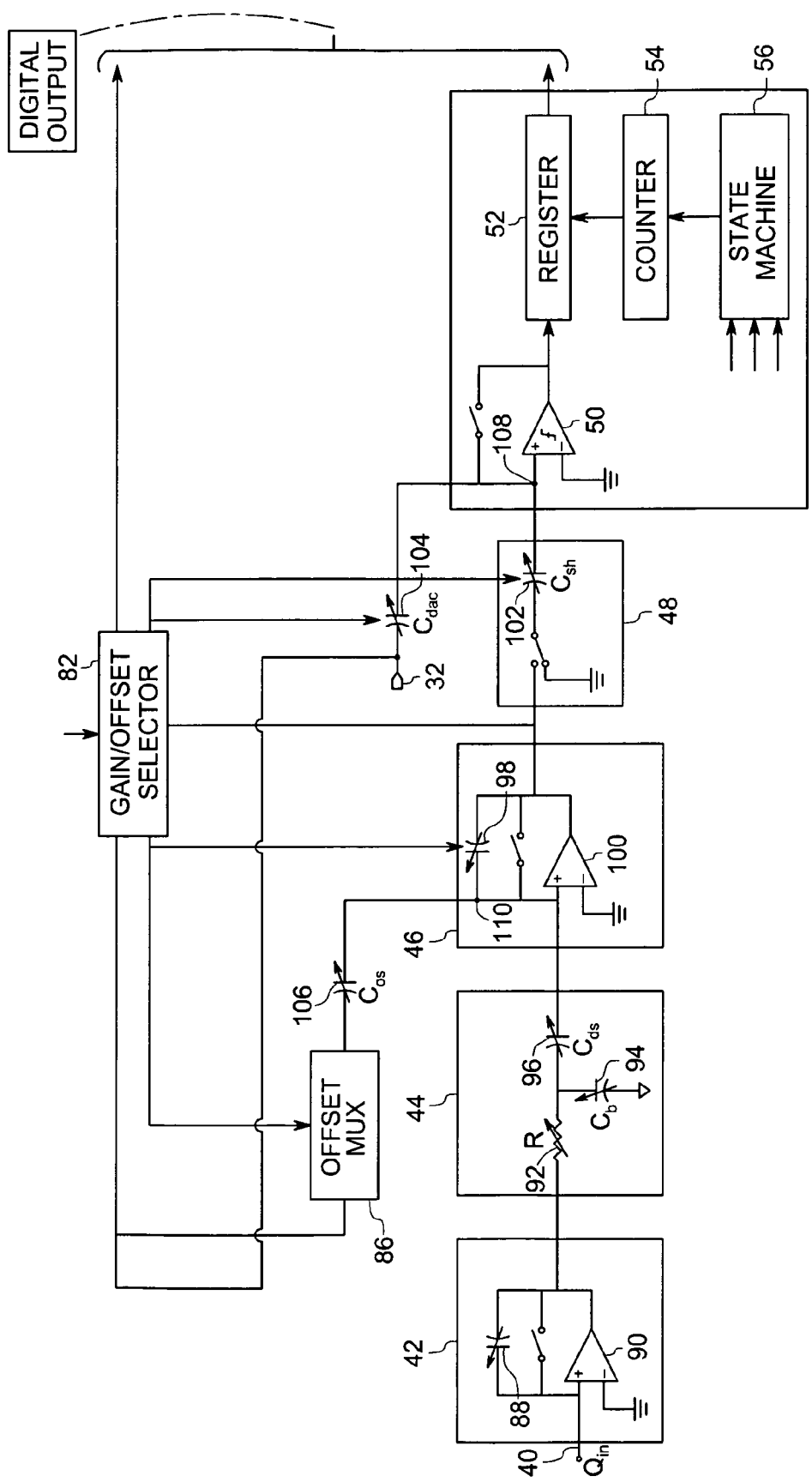
FIG. 7 is a detailed diagrammatic view of the architecture of the system shown in FIG. 6.

FIG. 7 is a detailed diagrammatic view of the architecture of ARC 30, shown in FIG. 6. The charge value $Q_{in}$ 40 from the detector 16 is fed to the integrator 42 comprising an integration capacitor 88 in a feedback loop of an amplifier 90. In addition to storing the charge value $Q_{in}$ 40 temporarily, the integrator 42 may serve to convert the charge value $Q_{in}$ 40 into a voltage equivalent. It may be noted that the low noise integrator 42 is reset each time prior to reading a fresh charge value $Q_{in}$ 40 so as to remove any charge stored in the capacitor 88. This voltage is fed into the low-pass-filter 44, which comprises a tunable resistor R 92, and tunable capacitors $C_b$ 94 and $C_{ds}$ 96. Because resistor R 92, and capacitors $C_b$ 94 and $C_{ds}$ 96 are tunable, the low-pass-filter 42 may be utilized to dynamically change the low-pass-filter bandwidth of the channel 38 during A/D conversion to obtain faster settling times and lower noise effective bandwidth.

The double sampling amplifier 46, comprising an integration capacitor 98 in a feedback loop of an amplifier 100, amplifies the output of the low-pass-filter 44. The double sampling amplifier 46 may be a correlated double sampling amplifier, for removing any reset-offset pedestal, as well as any kTC and reset noise of the integrator 42.

The output of double sampling amplifier 46 is sampled and held on a capacitor $C_{sh}$ 102, in the S/H circuit 48, at the input of the comparator 50. Digitization is achieved by disabling the parallel load of the counter value provided to the register 52 when the linear-polynomial ramp 64 exceeds the value held on the sample and hold capacitor $C_{sh}$ 102. The resulting conversion is transmitted via one of eight serial outputs (four channels per serial output) in a simultaneous fashion, thereby allowing transmission of digital data from all the thirty-two different channels 38 simultaneously. Pipelined conversion is facilitated by the S/H circuit 48. Integration, conversion and transmission are pipelined in consecutive Sync cycles, which comprise the reading cycles. The dynamic range of the system may be further extended by providing a bank of integration capacitors 86.

Because charge value $Q_{in}$ 40 is compared to the linear-polynomial ramp 64 during the fine ADC, therefore either the linear-polynomial ramp 64 or the charge value $Q_{in}$ 40 may be manipulated. Alternatively, both the linear-polynomial ramp 64 and the charge value $Q_{in}$ 40 may be manipulated. If the linear-polynomial ramp 64 is manipulated to generate a segment, which encompasses the charge value $Q_{in}$ 40, then the gain of the linear-polynomial ramp 64 may be changed by changing $G_p$ alone, and applying an offset $V_{offset}$(i) to implement equation $V(i)=V_{offset}(i)+Gain(i)*V_{base}$.

The linear-polynomial ramp 64 can be created by alternatively using a switch selectable capacitor bank having capacitors $C_1$, $C_2$, and $C_3$ (not shown) instead of capacitor $C_{dac}$ 104 prior to the comparator 50. Once the gain/offset selector 82, selects the gain value Gain(i) and the offset value $V_{offset}$, the offset value $V_{offset}$ provided by the offset multiplexer 86 may be applied through a capacitor, $C_{os}$ 106. However, changing only gain $G_p$ of the linear-polynomial ramp 64 to generate the segment may cause $C_{dac}$ 104 to become extremely large for implementation of all gains. Advantageously, gain decomposition may be implemented for changing gain $G_p$ of the linear-polynomial ramp 64. The ramp based fine A/D conversion compares the charge in the capacitors $C_1$-$C_3$. Capacitor $C_1$ may be the same as $C_{dac}$ 104 in gain decomposition implementation and provides an amplified version of the base ramp 66. Capacitor $C_2$, which may be the same as $C_{sh}$ 102, contains the sampled and held signal from the double sampling amplifier 46. The offset $V_{offset}$ is applied using $C_3$, which may be the same as $C_{os}$ 106. The voltage $V_X$ at node 108 is given by:

$$V_X = \frac{G*V_{ramp}*C_1 + V_{offset}*C_3 - V_{signal}*C_2}{C_1+C_2+C_3}$$

Therefore, $$V_X = \frac{G}{C_1+C_2+C_3}*\left[V_{ramp}*C_1 + \frac{V_{offset}}{G}*C_3 - \frac{V_{signal}*C_2}{G}\right].$$

When the voltage $V_X$ at node 108 transitions from positive to negative, or vice-versa, comparator 50 trips (i.e., is actuated) because the charge in $C_1$ (=$C_{dac}$) exceeds the charge from $C_2$ (=$C_{sh}$) and $C_3$ (=$C_{os}$). The equation can be rewritten as decomposition of a single channel gain $G_{channel}$ distributed into gains of integrator 42

$$\left(A_{int}=\frac{1}{G_{int}}\right),$$

double sampling amplifier 46

$$\left(A_{dsa}=\frac{1}{G_{dsa}}\right),$$

S/H circuit 48

$$\left(A_s=\frac{1}{G_s}\right),$$

and gain $G_p$, as follows:

$$V_X = \frac{A_{int}*A_{dsa}*A_s}{C_1+C_2+C_3}*\left[G_p*V_{ramp}*C_1 + \frac{V_{offset}}{A_{int}*A_{dsa}*A_s}*C_3 - \frac{V_{signal}*C_2}{A_{int}*A_{dsa}*A_s}\right]$$

where $A_{int}$, $A_{dsa}$, $A_s$ are the attenuation factors applied to reduce the gain of integrator 42, double sampling amplifier 44, and sampling capacitor ratio $C_{sh}$ 102, respectively. Consequently, the actual channel gain changes from the original $$G_{channel} = G_{int} * G_{dsa} * G_s \text{ to } G_{channel}$$
$$= \left(\frac{G_{int}}{A_{int}}\right) * \left(\frac{G_{dsa}}{A_{dsa}}\right) * \left(\frac{G_s}{A_s}\right).$$

The gain values $G_{int}$, $G_{dsa}$, $G_s$, and $G_p$ may be implemented as switch selectable capacitor banks, $C_{int}$ 88, $C_{dsa}$ 96, $C_s$ 102, and $C_{dac}$ 104. The offset may be implemented by applying $V_{offset}$ through capacitor $C_{os}$ 106 at either node 108 or 110. By choosing node 110, a single capacitor bank implementing the gain of the double sampling amplifier 46 manipulates both the signal and offset optimally. Therefore, the gain of the channel changes as a function of the signal, providing optimal signal-to-noise performance.

In one embodiment, the detector 16 may use an amorphous silicon field effect transistor (FET), as a switch to release the charge value $Q_{in}$ 40 from the detector 16. The amorphous silicon FET may subject the detector 16 to transients, which may provide incorrect auto-ranging. Thus, in this architecture, $G_{int}$ is set as a constant to overcome incorrect auto-ranging. The value of $G_{int}$ may be application specific. Hence, without loss of generality, the total gain may be considered as $G = A_{dsa} * A_s * A_p$. In other words, the total gain G will be dynamically distributed to $A_{dsa}$, $A_s$, and $A_p$. Because double sampling amplifier 46 has the maximum impact on the noise performance in the back-end stages, to optimize noise performance, $A_{dsa}$ may be minimized (i.e. $G_{dsa}$ is maximized), and As may be minimized (i.e. $G_s$ is maximized). If $A_{dsa}$ is small, $G_p$ may be minimized. If both $A_{dsa}$ and $A_s$ are minimum, then $G_p$ will be maximized.

For example, in an exemplary application, $G_{dsa}$ can be set to 1, 2, or 4; $G_s$ to 1, 2, or 4; and $G_p$ to 1 or 2. Given these conditions, to achieve a total DAC gain of G=4, then $G_{dsa}$ may be set according in the following manner: $A_{dsa}$ can be set 1, i.e. $G_{dsa}$=4, which is the maximum gain of double sampling amplifier 46. Thus, $$A_s * G_p = \frac{G}{A_{dsa}} = \frac{4}{1} = 4,$$

which will be distributed to $A_s$ and $G_p$. Because the maximum gain for $G_s$ is 4, we set $A_{dsa}$=2, i.e. $G_s$=2. Moreover, because $$G_p = \frac{G}{A_{dsa} * A_s} = \frac{4}{1*2} = 2,$$

therefore, the final gain distribution for a total DAC gain of 4 is $A_{dsa}$=1, $A_s$=2, and $G_p$=2. Alternatively, $A_{dsa}$=2, $A_s$=2, and $G_p$=1, or, $A_{dsa}$=4, $A_s$=1, and $G_p$=1. However, such alternatives may not achieve better signal-to-noise ratio because the signal gain is not maximized. Thus, each segment has properties of gain ($G_{dsa}$, $G_s$, $G_p$) and offset $V_{offset}$ associated with it. These properties may be encoded and stored in a register file within the ARC 30.

An auto-ranging algorithm that may be followed is as below:

$V_{os0} \leq V_{dsa} < V_{os1}$, then $V_{os} = 0$ and $G = 1$;

$V_{os1} \leq V_{dsa} < V_{os2}$, then $V_{os} = V_{os1}$ and $G = G_1$;

$V_{os2} \leq V_{dsa} < V_{os3}$, then $V_{os} = V_{os2}$ and $G = G_2$;

$V_{os3} \leq V_{dsa} < V_{os4}$, then $V_{os} = V_{os3}$ and $G = G_3$;

$V_{osN-1} \leq V_{dsa} < V_{osN}$, then $V_{os} = V_{osN-1}$ and $G = G_N$;

An alternate algorithm that maximizes SNR is as follows $V_{os0} \leq V_{dsa} < V_{os1}$, then $V_{os} = 0$ and $G_{channel} = G_{max}$ $V_{os1} \leq V_{dsa} < V_{os2}$, then $V_{os} = V_{os1}\left(\frac{G_{max}}{G_1}\right)$ and $G_{channel} = \frac{G_{max}}{G_1}$ $V_{os2} \leq V_{dsa} < V_{os3}$, then $V_{os} = V_{os2}\left(\frac{G_{max}}{G_2}\right)$ and $G_{channel} = \frac{G_{max}}{G_2}$ $V_{os3} \leq V_{dsa} < V_{os4}$, then $V_{os} = V_{os3}\left(\frac{G_{max}}{G_3}\right)$ and $G_{channel} = \frac{G_{max}}{G_3}$ $V_{osN-1} \leq V_{dsa} < V_{osN}$, then $V_{os} = V_{osN-1}$ and $G_{channel} = 1$ where $G_{max} = G_{int_{Max}} * G_{dsa_{Max}} * G_{s_{Max}} = G_N$. The original base ramp 66 is multiplied by $G_{max}$ to span the entire power supply. It may be noted that the channel gain is selected after the comparator 50 at the output of the double sampling amplifier 46 has determined the segment.

Gain distribution may be implemented in the architecture shown in FIG. 7. The DAC 32 is distributed to the double sampling amplifier 46 and sampling capacitor ratio during fine A/D conversion. The coarse ADC quantizes the output of double sampling amplifier 46 to determine signal range and then the gain/offset selector 82 applies appropriate offset $V_{offset}$ to the input of double sampling amplifier 46 and gain to the following stages, including double sampling amplifier 46.

Figure 8:
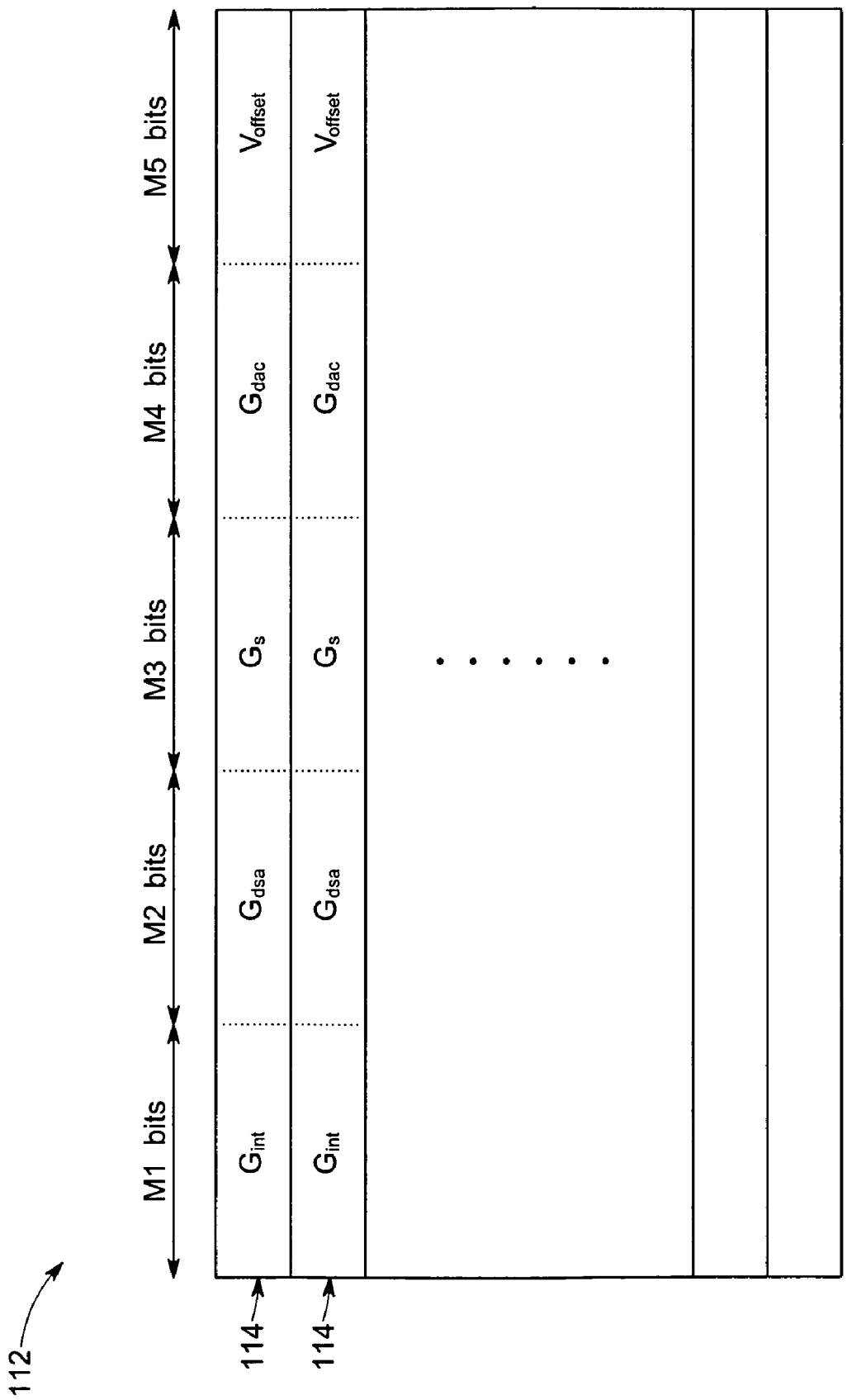
FIG. 8 is a diagrammatic view of an exemplary memory stack utilized in the digital acquisition system in accordance with aspects of the present technique.

Referring generally to FIG. 8, a diagrammatic view of an exemplary memory stack 112 utilized in the digital acquisition system is illustrated. The memory stack 112 comprises information stored in registers 114, each having bit allocations for the various gain and offset values, such as, hints $G_{int}$, $G_{dsa}$, $G_s$, and $V_{offset}$. As illustrated, in register 114, M1 bits may be allocated to $G_{int}$, M2 bits may be allocated to $G_{dsa}$, M3 bits may be allocated to $G_s$, and M4 bits may be allocated to $V_{offset}$. During the coarse A/D conversion, the segment is determined. Once the segment is determined, the gain/offset selector 82 selects the various gains and offset values noted above from the memory stack 112. Thus, memory stack 112 serves as a look-up-table that stores the different gain & offset combinations to be used in a given segment. It may be noted that in the memory stack 112, there may be N registers, and therefore, the size of the memory stack 112 may be equal to N*(M1+M2+M3+M4) bits. Such implementation of the technique may be used to render the same basic system and hardware adaptable to a wide range of applications, systems, conversions and relationships between input signals and output signals (count values).

It may be noted that several DACs (equal to the number of segments) may be utilized to provide fine A/D conversion for each channel once the segment is identified. For example, if the DAC output signal is divided into six segments, then six DACs may be provided in common to all the thirty-two channels, such that each of the DACs is dedicated to a single segment. Moreover, in such case, the gain and offset values for the respective segments may be pre-defined for the segment, and the system will apply the same automatically while performing the fine A/D conversion.

Figure 9:
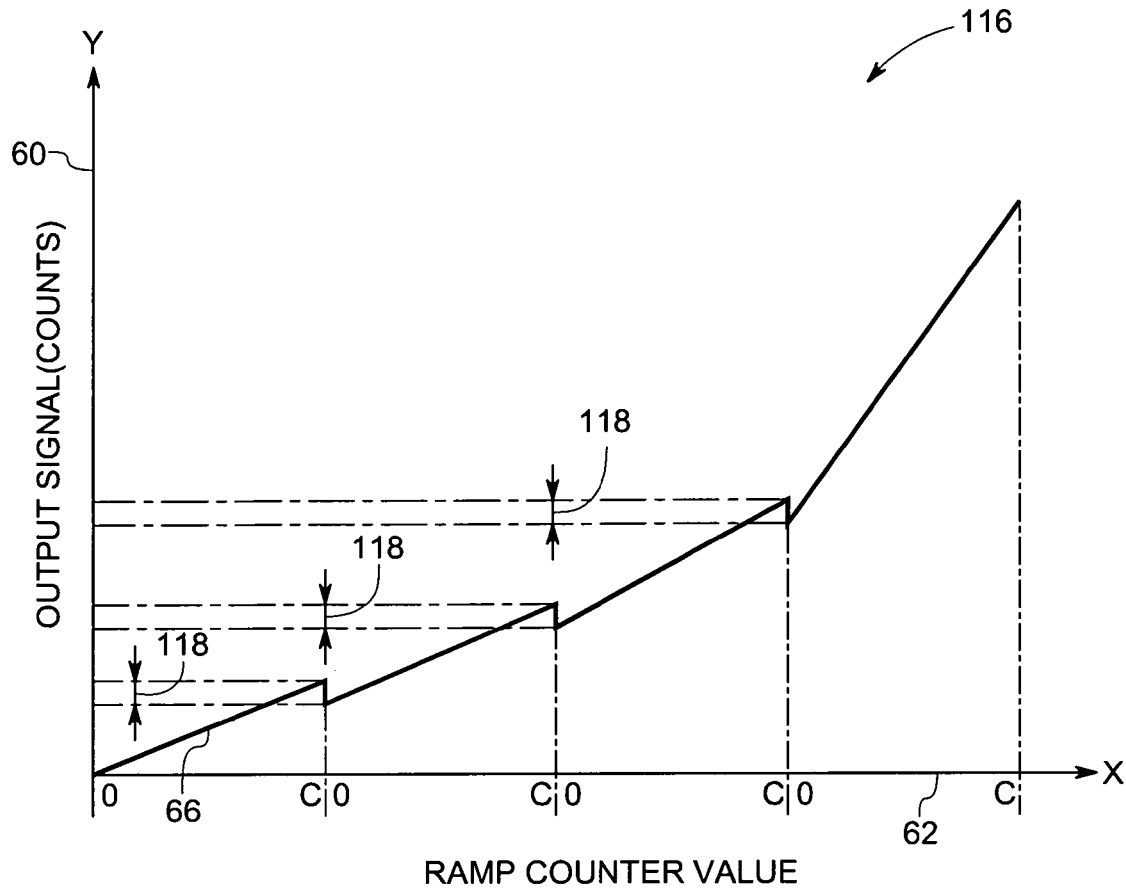
FIG. 9 is a graphical illustration of the segmented linear-polynomial path followed by the DAC output signal in accordance with aspects of the present technique.

Referring generally to FIG. 9, a graphical illustration 116 of the segmented linear-polynomial path followed by the DAC output signal is shown. As illustrated, after every C counts, the DAC output signal assumes a linear segment that conforms to the linear-polynomial path 64. Non-optimal gain values provided during transformation of the base ramp 66 to the desired segment may result in dead bands. Similarly, variation in non-ideal implementation of offset value may result in dead bands. Such effects may provide erroneous digital output of the charge value $Q_{in}$ 40. However, sufficient overlap 118 between segments may be provided to avoid dead zones caused by capacitor mismatches, offset errors, and other chip processing imperfections.

Figure 10:
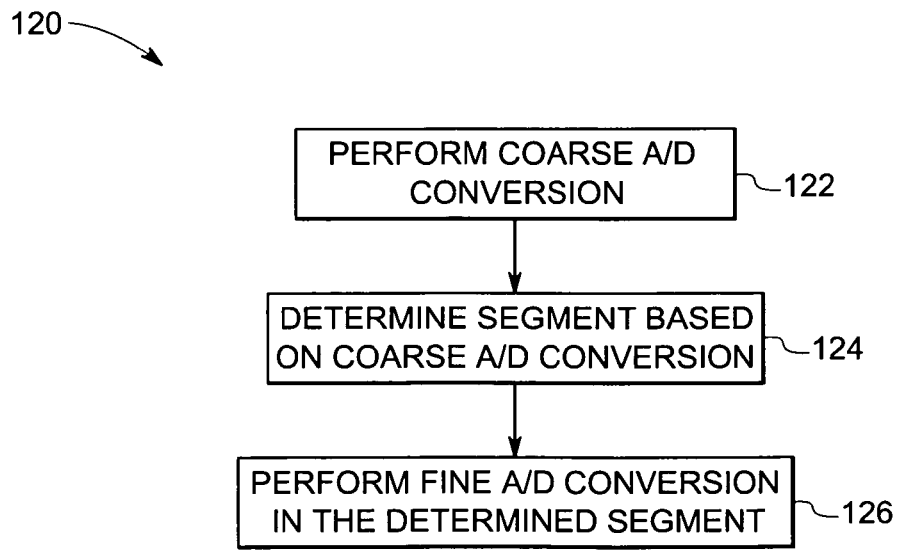
FIG. 10 is a flowchart illustrating an exemplary digital signal conversion process in accordance with an exemplary embodiment of the invention.

FIG. 10 is a flowchart illustrating the digital signal conversion process 120. As illustrated in process 120, a coarse A/D conversion is performed by the ARC 30 (block 122). The coarse A/D conversion may be utilized to determine the segment information (block 124). The segment information comprises the segment in which the digital equivalent of the input signal (e.g., charge value $Q_{in}$) 40 lies. Once the segment is determined, the digital signal conversion process 120 proceeds with performing a fine A/D conversion to determine the digital equivalent of the input signal (e.g., charge value $Q_{in}$) 40 (block 126).

The teachings of the present techniques may be implemented in systems where A/D conversion of a plurality of analog values is performed via a single DAC. Such systems may include digital X-ray systems, digital cameras, as well as other applications outside the imaging field. The teachings of the present techniques enable faster signal conversion. Moreover, advantages of the techniques include increased dynamic range with faster rates of conversion at lower power consumption, appropriate signal conditioning prior to conversion, optimized noise performance, and self test capability without reliance on external stimulus for providing precise amounts of charge to validate the system. Dynamically changing the bandwidth during a scan may allow obtain faster settling times and lower noise effective bandwidth.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method for converting an analog signal to a digital signal, comprising:
   receiving a sampled analog signal;
   selecting one of a plurality of segments of a segmented relation between DAC output values and desired ADC input values;
   applying desired gain and offset values to the DAC output values or to the sampled analog signal based upon The selected segment; and
   converting the sampled analog signal to a digital signal based upon the desired gain and offset values.

2. The method of claim 1, wherein applying desired gain and offset values comprises applying the desired gain and offset values independently to each of a plurality of channels that share the DAC output values, based upon a sampled analog signal received by each of the plurality of channels respectively.

3. The method of claim 1, wherein selecting one of the plurality of segments comprises selecting linear segments.

4. The method of claim 1, wherein selecting one of the plurality of segments of and the desired ADC input values comprises selecting one of the plurality of segments having a linear-polynomial relationship between the DAC output values and the desired ADC input values.

5. The method of claim 1, wherein selecting one of the plurality of segments comprises selecting DAC output values that follow a linear relationship with DAC input values.

6. The method of claim 1, wherein converting the sampled analog signal to the digital signal comprises applying a value derived from the DAC output values and a value derived from the sampled analog signal value to a comparator.

7. The method of claim 6, wherein applying the value derived from the DAC output values comprises multiplying the DAC output values by a desired gain.

8. The method of claim 7, wherein applying the value derived from the sampled analog signal value comprises multiplying the sampled analog signal value by the desired gain.

9. The method of claim 6, wherein applying a value derived from the DAC output values comprises modifying the DAC output values by a desired offset value.

10. The method of claim 6, wherein converting the sampled analog signal to the digital signal comprises representing the digital signal by a counter value based upon a desired relationship between the DAC output values and the sampled analog signal value applied to the comparator.

11. The method of claim 10, wherein representing the digital signal by the counter value comprises representing the digital signal by a counter value when the DAC output values is substantially equal to the sampled analog signal value applied to the comparator.

12. The method of claim 10, further comprising storing the selected segment and the counter value.

13. The method of claim 10, further comprising determining the digital value by reference to the selected segment and the counter value.

14. A method for digitizing a scanned X-ray signal, comprising:
   receiving a sampled analog signal representative of charge from a pixel on a digital X-ray panel;
   selecting one of a plurality of segments of a segmented relation between DAC output values and desired ADC input values;
   applying desired gain and offset values to the DAC output values and to the sampled analog signal based upon the selected segment; and
   converting the sampled analog signal to a digital signal based upon the desired gain and offset values.

15. The method of claim 14, wherein receiving a sampled analog signal comprises receiving a plurality of charge values from a plurality of pixels.

16. An analog to digital converter configured to provide a digital output signal representative of an analog input signal, comprising:
   a plurality of ADC channels, each of the plurality of ADC channels comprising:
      an analog front-end operable to pre-condition the analog input signal; and
      a gain and offset selector operable to provide segment data and create one of a plurality of segments from a base ramp based on the segment data; and a DAC operable to provide a DAC output signal based on the base ramp and the segment data, wherein the analog input signal is compared with the DAC output signal in a selected segment of the DAC output signal for providing the digital output signal.

17. The analog to digital converter of claim 16, wherein each of the plurality of ADC channels comprises a comparator configured to compare the analog input signal with the DAC output signal in the selected segment.

18. The analog to digital converter of claim 16, wherein the digital output signal comprises the segment data and a counter value provided to the DAC when the analog input signal and the DAC output signal in the selected segment are substantially equal.

19. The analog to digital converter of claim 16, the analog front-end comprising:
   an integrator operable to integrate the analog input signal;
   a low-pass-filter operable to reduce noise in the analog input signal, wherein the low-pass-filter is coupled to the integrator;
   a double sampling amplifier operable to remove noise generated within the analog front-end, wherein the double sampling amplifier is coupled to the low-pass-filter; and
   a sample and hold circuit operable to decouple the analog front-end from the gain and offset selector, wherein the sample and hold circuit couples the double sampling amplifier and the gain and offset selector.

20. The analog to digital converter of claim 19, wherein the analog front-end is operable to reduce settling times by dynamically tuning a time constant of the low-pass-filter.

21. The analog to digital converter of claim 20, wherein the analog front-end is operable to increase conversion speed by dynamically tuning the time constant of the low-pass-filter.

22. The analog to digital converter of claim 20, wherein the analog front-end is operable to reduce noise effective bandwidth by dynamically tuning the time constant of the low-pass-filter.

23. A data acquisition system for a digital X-ray panel, comprising:
   a plurality of pixels, wherein each of the plurality of pixels is configured to store a charge;
   a plurality of ADC channels, wherein each of the plurality of ADC channels is coupled to each of the plurality of pixels and each of the plurality of ADC channels comprises:
   an analog front-end operable to pre-condition an analog input signal representative of the charge stored on each of the plurality of pixels; and
   a gain and offset selector operable to provide a segment data and create one of a plurality of segments from a base ramp based on the segment data; and
   a DAC operable to provide DAC output signal based on the base ramp and the segment data, wherein the analog input signal is compared with the DAC output signal in a selected segment of the DAC output signal for providing the digital output signal.

* * * * *

UNITED STATES PATENT AND TRADEMARK OFFICE
CERTIFICATE OF CORRECTION

PATENT NO. : 7,570,185 B2  Page 1 of 1
APPLICATION NO. : 11/023669
DATED : August 4, 2009
INVENTOR(S) : Rao et al.

It is certified that error appears in the above-identified patent and that said Letters Patent is hereby corrected as shown below:

On the Title Page, in Item (56), under "U.S. PATENT DOCUMENTS", in Column 2, Line 5, delete "Turner et al." and insert -- Tumer et al. --, therefor.

In Column 12, Line 7, in Claim 4, after "segments" delete "of".

Signed and Sealed this

First Day of June, 2010

David J. Kappos
*Director of the United States Patent and Trademark Office*